Feb. 7, 1967 F. G. KELLY 3,302,703

THERMAL VALVE

Filed July 3, 1964

INVENTOR:
FRANKLIN G. KELLY,

BY [signature]

AGENT.

United States Patent Office 3,302,703

Patented Feb. 7, 1967

3,302,703
THERMAL VALVE

Franklin G. Kelly, Long Beach, Calif., assignor to TRW Inc., a corporation of Ohio Filed July 3, 1964, Ser. No. 380,136
4 Claims. (Cl. 165—135)

This invention relates to a thermal valve and more particularly to a controllable thermal valve in which the thermal conductivity can be variable upon command.

In this invention there is disclosed two different embodiments, one electrical in nature and the other mechanical in nature in which the thermal conductivity is variable thereby providing a measure of control over the flow of heat from a first member to a second member. This invention is not to be confused with refrigeration or cooling techniques in which heat is pumped from one area to another. The pumping systems may use the so-called Peltier effect which is more akin to a heat pumping arrangement. In this invention, it is possible, upon command, to provide a path of either low or high thermal conductivity between a first member and a second member.

In one embodiment of this invention, a transistor or preferably a large semiconductor diode is connected between a heat source and a heat sink and in the electrical forward direction measured from the heat source to the heat sink. In order to provide electrical isolation, a material of high thermal conductivity and high dielectric constant such as beryllia is connected in series with the leads from the diode. It was discovered that reverse biasing the diode provided a thermal barrier between the heat source and the heat sink whereas a forward bias on the diode provided a heat path of high conductivity between the heat source and the heat sink. By making the biasing means responsive to the temperature of the heat source or the heat sink, it is possible to control and maintain the temperature of the heat source at some predetermined value.

The second embodiment for controlling thermal conductivity between members represents a mechanical implementation of the same principles of the disclosed invention. In this embodiment, a heat source and a heat sink are separated by a gap which is substantially filled with a gas having a low thermal conductivity such as $CO_2$ gas. A liquid thermal conductor, such as mercury, is inserted in the gap which is sealed at both ends thereby placing the gas under pressure. A reservoir in the form of a bellows holds the major supply of the mercury in definite proportions whereby pressure on the bellows causes the mercury to substantially fill the gap and thereby provide a low thermal path across the gap. With no external pressure on the bellows, the mercury is forced substantially completely into the bellows by the gas under pressure thereby providing a gap filled with a thermally insulating gas between the heat source and the heat sink.

Further objects and advantages of the present invention will be made more apparent by referring now to the accompanying drawings wherein.

Figure 3:
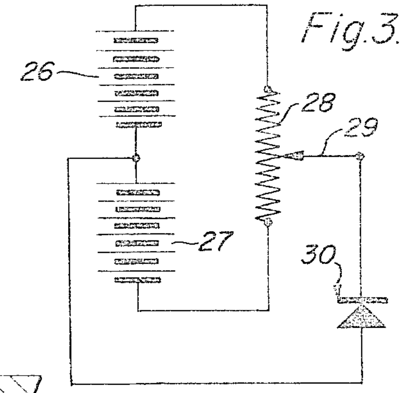
Figure 4:
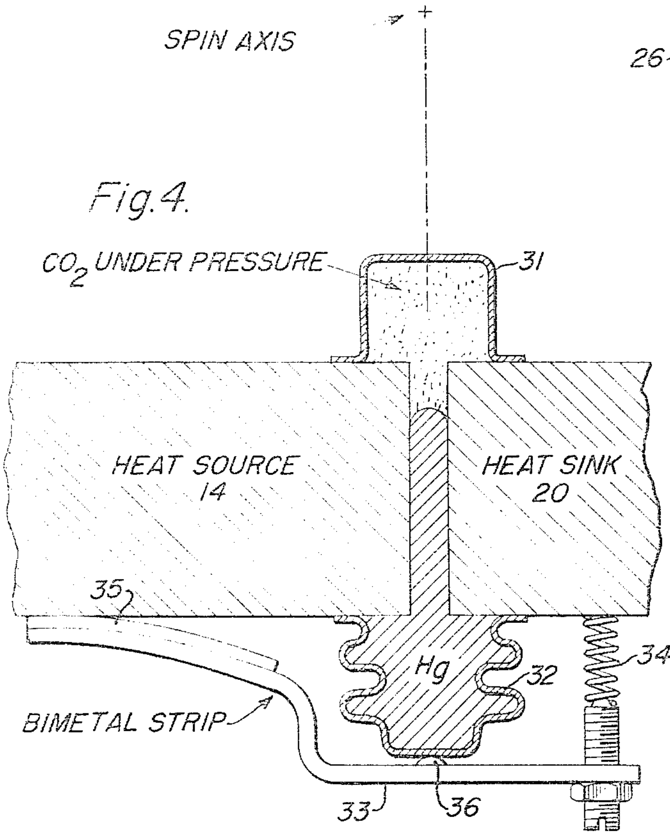

FIG. 3 as a schematic diagram illustrating how a junction diode may be used according to the teachings of this invention; and FIG. 4 is a diagram illustrating a mechanical implementation of the invention.

Figure 1:
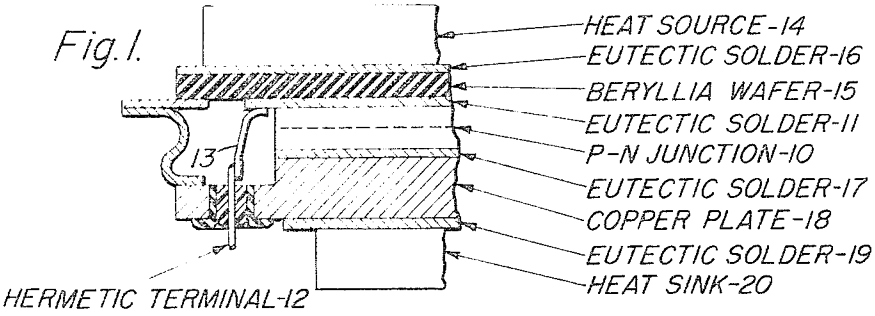
FIG. 1 is a cross section of a semiconductor diode constructed according to the teachings of this invention.

Referring now to FIG. 1, there is shown in cross section a P–N junction 10 having a surface area determined by the thermal resistance required. Bonded to one side of the junction 10 is a eutectic solder 11 which forms a basis for connecting a biasing voltage through a hermetically sealed terminal 12 to an internal lead 13 which connects the terminal 12 to the eutectic solder 11. The P–N junction is electrically insulated from the heat source 14 by a beryllia wafer 15 which has a high thermal conductivity and a high dielectric constant. The opposite end of the beryllia wafer 15 contains a eutectic solder 16 to which the heat source 14 is attached and which insures a low thermal path from the heat source to the P–N junction. The opposite end of the P–N junction 10 is bonded to eutectic solder 17 to which a copper plate 18 is attached to thereby insure good electrical and thermal contact to the P–N junction. The opposite end of the copper plate 18 is connected to eutectic solder 19 to which a heat sink 20 is attached. A lead can be attached to the eutectic solder 19 which will thereby provide a circuit for the biasing voltage through the eutectic solder 19, the copper plate 18 and the solder 17 to the P–N junction 10. The circuit for the terminal 12 comprises internal lead 13, and solder 11 to the P–N junction 10. In the usual case, the heat sink 20 could be grounded which would act as one terminal for the system. For those systems requiring both terminals to be insulated from the heat source 14 and the heat sink 20, it is only necessary to interpose a beryllia wafer between the eutectic solder 19 and the heat sink 20 and connect the second terminal to the eutectic solder 19. These insulating techniques are well known in the art and are considered ancillary to the disclosed invention.

Figure 2:
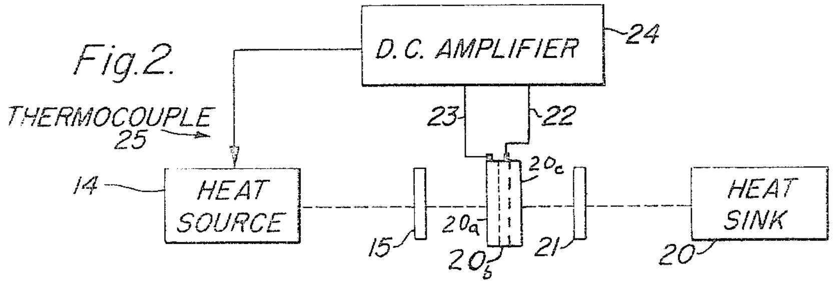
FIG. 2 is a block diagram illustrating a transistor application of the thermal valve.

Referring now to FIG. 2, there is shown in block form a system concept using a transistor having an emitter 20*a*, base 20*b* and a collector 20*c*. A heat source 14 is illustrated as being mechanically and thermally connected to a beryllia wafer 15 which is in turn mechanically and thermally connected to the emitter 20*a*. The collector 20*c* is mechanically and thermally connected to a second beryllia wafer 21, the other side of which is mechanically and thermally connected to a heat sink 20. A pair of leads 22 and 23 are electrically attached to the emitter 20*a* and the base 20*b* and are connected to a biasing means identified as a D.C. amplifier 24. A suitable thermocouple 25 arranged to detect temperature fluctuations in the heat source 14 is connected in a driving relationship with the D.C. amplifier 24 so as to control the biasing of the P–N junction between the emitter 20*a* and the base 20*b* whenever the temperature of the heat source 14 exceeds predetermined limits. In this manner, the thermocouple 25 is made responsive to the temperature difference between the heat source 14 and the heat sink 20 to thereby control the thermal conductivity of the P–N junction 10. Depending on the needs of the system and the application of the thermal valve, additional thermocouples may be connected to the heat sink for controlling the D.C. amplifier in combination with the thermocouple 25 or as a sole means of controlling the temperature of the heat sink 20.

Referring now to FIG. 3, there is shown a schematic diagram of a manually operated circuit for achieving the biasing voltage capable of varying the biasing conditions on a diode from a forward direction to a reverse biased direction. There is illustrated, batteries 26 and 27 connected in series with the resistance portion of a potentiometer 28. The operating terminal 29 of the potentiometer is connected to one terminal of a diode 30 representing a P–N junction. The opposite terminal of the diode 30 is connected intermediate the connection between batteries 26 and 27. A review of the circuit will show that whenever operating arm 29 is centrally located in the potentiometer 28 that a zero potential will exist across the diode 30. It can be shown further that moving the operating arm 29 in the direction of battery 26 will make the arm 29 positive and hence make the cathode portion of diode 30 positive with respect to the anode. Similarly, moving the operating arm 29 in a direction of battery 27 will make operating arm 29 negative and hence an opposite biasing polarity will be presented across diode 30. It is well known that approximately 0.6 volt across a silicon diode in the direction of current flow will bias the diode in a forward direction and according to the teachings of this invention will raise the thermal conductivity to thereby permit passage of heat. Similarly, it has been discovered that reverse biasing the diode will lower the thermal conductivity of the diode thereby presenting a thermal barrier to the passage of heat. As mentioned previously, there is no heat pumping effect associated with this invention and as a result once the diode is biased in the forward direction, heat will flow from the higher temperature to the lower temperature but not from the lower temperature to a higher temperature as is associated with so-called pumping techniques.

Referring now to FIG. 4 there is shown a mechanical embodiment of a thermal valve capable of varying the thermal conductivity from a heat source 14 to a heat sink 20. The heat source 14 and the heat sink 20 are located in close proximity to each other so as to define an interface which is substantially filled with a gas having a substantially low thermal conductivity such as $CO_2$. One end of the interface is sealed by means of a sealing device 31 which provides a reservoir arrangement for the gas. The opposite end of the interface is sealed by means of a bellows arrangement 32 which contains a liquid thermal conductor such as mercury. The bellows is of such a size that the pool of mercury is capable of being stored in the bellows as a reservoir when the bellows 32 is fully extended. Pressure on the bellows will cause the mercury to be forced into the interface between the heat sink and the heat source thereby displacing the gas into its reservoir 31. Pressure on the bellows 32 is controllable by means of an arm 33 having an adjustable spring 34 at one end and being pivotally connected at the other end on the heat source 14. A bimetallic strip 35 attached to the arm 33 and held in thermal contact with the heat source 14 is arranged to move the arm 33 in response to the temperature of the heat source 14. A button 36 attached to the arm 33 contacts the bellows 32 and thereby provides the necessary pressure and movement against the bellows 32 in response to the movement of arm 33 as determined by the temperature of the heat source 14. In operation and depending upon the adjustment of the spring 34, a low temperature in the heat source 14 will cause the arm 33 to move away from the bellows 32 thereby causing the gas under pressure in the container 31 to push the mercury in the interface back into the bellows 32 which thereby provides a high resistance thermal path in the interface between the heat source 14 and the heat sink 20. Conversely, high temperature in the heat source 14 will cause the arm 33 to bend inwardly so as to exert a pressure on the bellows 32 thereby forcing the mercury into the interface and thereby presenting a thermal path having a high thermal conductivity between the heat source 14 and the heat sink 20. The disclosed device is capable of working in a gravity free environment, by providing an artificial gravity to make certain the mercury remains in the bellows 32. In such an application the thermal switch can be positioned with respect to the spin axis as shown.

This completes the description of the embodiments of the invention illustrated herein, however, many modifications and advantages of this invention will be apparent to those skilled in the art. For example, in both embodiments, it is recognized that heat leakage appears between the heat sink and the heat source must be guarded against in order to obtain the efficiencies inherent in the disclosed invention. In the mechanical embodiment, it is recognized that both the bellows and the gas reservoir must be thermally insulated from both the heat sink and the heat source to prevent parallel thermal paths. These techniques are certainly within the skill of knowledgeable persons skilled in the art. Accordingly, it is desired that this invention not be limited to the particular details of the embodiment disclosed herein, except as defined by the appended claims.

The embodiments of the invention in which an exclusive property or privilege is claimed are defined as follows:

1. In combination, a heat source and a heat sink in close proximity to each other, a P material and an N material joined to form a junction, said P–N junction connected between said heat source and said heat sink and electrically insulated from said heat sink and said heat source, said P material and said N material being oriented between said heat source and said heat sink such that heat flows from the heat source to the heat sink through one of said materials then through the junction then through the other of said materials, and electrical biasing means for controlling the biasing of said P–N junction whereby forward biasing raises the thermal conductivity and reverse biasing lowers the thermal conductivity.

2. A combination according to claim 1 in which said P–N junction is a semiconductor diode.

3. A combination according to claim 1 which includes beryllia insulators intermediate said P–N junction and said heat source and said heat sink.

4. In combination, a heat source and a heat sink in close proximity to each other, a transistor having at least a base, an emitter and a collector, said emitter and said collector being thermally connected and electrically insulated from said heat source and said heat sink respectively, and biasing means for varying the potential difference between said base and said emitter whereby forward biasing raises the thermal conductivity and reverse biasing lowers the thermal conductivity.

References Cited by the Examiner

UNITED STATES PATENTS

| | | | |
|---|---|---|---|
| 1,887,687 | 11/1932 | Killeffer | 165—96 X |
| 2,363,375 | 11/1944 | Wild | 165—96 X |
| 2,734,344 | 2/1956 | Lindenblad | 136—204 X |
| 2,938,357 | 5/1960 | Sheckler | 136—203 X |
| 3,017,522 | 1/1962 | Lubcke. | |
| 3,157,801 | 11/1964 | Shequen | 62—3 X |
| 3,207,159 | 9/1965 | Tateisi | 62—3 X |

ROBERT A. O'LEARY, *Primary Examiner.*

N. R. WILSON, A. W. DAVIS, *Assistant Examiners.*